(12) United States Patent
Kano et al.

(10) Patent No.: US 6,399,923 B2
(45) Date of Patent: Jun. 4, 2002

(54) HEATING FURNACE INCLUDING VERTICALLY SPACED-APART DOUBLE-SIDED FAR-INFRARED-RADIATION PANEL HEATERS DEFINING MULTI-STAGE DRYING CHAMBERS

(75) Inventors: Takahiro Kano, Nagoya; Hisayasu Tachikawa, Hashima; Tamotsu Sakai, Aichi-ken, all of (JP)

(73) Assignee: Noritake Co., Limited, Nagoya (JP)

( * ) Notice: Subject to any disclaimer, the term of this patent is extended or adjusted under 35 U.S.C. 154(b) by 0 days.

(21) Appl. No.: 09/839,128

(22) Filed: Apr. 23, 2001

(30) Foreign Application Priority Data

May 2, 2000 (JP) ........................................ 2000-133634

(51) Int. Cl.[7] ................................................ F26B 3/02
(52) U.S. Cl. ..................... 219/411; 219/390; 219/395; 219/540; 34/267; 34/211
(58) Field of Search .................... 219/411, 390, 219/395, 400, 540; 392/416, 418, 375; 118/724, 725, 501; 34/267, 211

(56) References Cited

U.S. PATENT DOCUMENTS 5,607,609 A * 3/1997 Sakuyama et al. .......... 219/388
5,850,071 A * 12/1998 Makiguchi et al. ......... 219/390
5,911,896 A * 6/1999 Holden et al. .............. 219/390

* cited by examiner

Primary Examiner—Teresa Walberg
Assistant Examiner—Shawntina T. Fuqua
(74) Attorney, Agent, or Firm—Oliff & Berridge, PLC

(57) ABSTRACT

A multi-stage heating furnace for drying large-sized substrates arranged in a stack, including a furnace body, and shelf heaters arranged within the furnace body such that the shelf heaters are spaced from each other in a vertical direction at a predetermined spacing pitch and such that adjacent ones of the shelf heaters partially define drying chambers for accommodating the respective substrates, wherein each shelf heater consists of a far-infrared-radiation panel heater of double-side heating type including a heat radiating plate in which a heat-generating body is embedded, and the panel heater has opposite major surfaces covered with respective thin ceramic layers which emit a far infrared radiation when the heat radiating plate is heated by energization of the heat-generating body.

10 Claims, 8 Drawing Sheets

HEATING FURNACE INCLUDING VERTICALLY SPACED-APART DOUBLE-SIDED FAR-INFRARED-RADIATION PANEL HEATERS DEFINING MULTI-STAGE DRYING CHAMBERS

This application is based on Japanese Patent Application No. 2000-133634 filed on May 2, 2000, the contents of which are incorporated hereinto by reference.

BACKGROUND OF THE INVENTION

1. Field of the Invention

The present invention relates to a multi-stage heating furnace arranged to heat a stack of large-sized substrates in the form of glass plates used for a liquid crystal display (LCD) panel and a plasma display panel (PDP), and a heating type far-infrared-radiation panel heater. The present invention is also concerned with a method of controlling flows of a fluid (air) through the heating furnace.

2. Discussion of Related Art

In the manufacture of large-sized substrates for the liquid crystal display (LCD) panel and plasma display panel (PDP) indicated above, it is indispensable to perform drying and heating steps for drying and heating the substrates after washing and after application of a coating, to remove a washing liquid and a solvent contained in the coatings. To this end, a heating furnace is required. The substrates are thin rectangular sheets each side of which has a length of about 1.0–2.0 m and the thickness of which is about 0.7–3.0 mm. Thus, the substrates to be dried and heated are considerably large.

Heating furnaces generally used to dry and heat such large-sized substrates include, for instance: (1) a heating furnace of hot-air circulating type; (2) a heating furnace of far-infrared-radiation type; and (3) a heating furnace of hot-plate type. The heating furnace of hot-air circulating type can be easily designed to heat the substrates arranged in a stack, and has an advantage in the efficiency of space utilization. However, the heating furnace of hot-air circulating type suffers from difficult control of temperature distribution and contamination of the substrate with a dust blown by the hot air. Therefore, this type of heating furnace is not suitable for drying the large-sized substrates, where the substrates are required to be dried in a clean atmosphere with an even distribution of the heating temperature over the entire area of the substrate surface.

The heating furnace of far-infrared-radiation type has the following advantages: improved heating efficiency for removing the solvent; a comparatively high degree of accuracy of control of the heating temperature for even distribution over the entire range of the substrate surface, by controlling a heater; and a comparatively high degree of cleanliness of the atmosphere within the furnace, owing to radiation heating without circulation of a hot air. However, the heating furnace of far-infrared-radiation type is generally required to position its heating portion (adapted to generate a far infrared radiation) in opposed relationship with the substrates, for effecting the radiation heating of the substrates. Accordingly, the heating furnace of this type is usually required to be a tunnel furnace (continuous furnace) in which the substrates to be dried are fed one after another along a horizontal path by a suitable conveying mechanism. The tunnel type heating furnace must have a relatively large overall length and accordingly requires a relatively large installation space, where the substrates are required to be dried to a comparatively large extent per unit time or where the substrates have a relatively large size, as indicated above.

The heating furnace of hot-plate type is arranged to effect conduction heating on the lower side of the substrates, and therefore has advantages of even or uniform heating (even distribution of the heating temperature) and a relatively high rate of rise of the heating temperature, where the substrates have a relatively small size. Where the substrates are relatively large, however, this type of heating furnace suffers from the following drawbacks: difficulty to achieve even heating: lower heating efficiency for removing the solvent contained in the coating applied to the upper surface of each substrate, than in the heating furnace of far-infrared-radiation heating; and requirement for a relatively large installation space where the hot-plate type heating furnace is designed to be a tunnel or continuous type furnace.

SUMMARY OF THE INVENTION

It is therefore a first object of the present invention to provide a multi-stage heating furnace which is capable of heating large-sized substrates in a clean atmosphere with a high degree of accuracy of temperature control and which requires a reduced installation space.

A second object of the invention is to provide a far-infrared-radiation panel heater suitable for use in the heating furnace of the present invention. A third object of the invention is to provide a method suitable for controlling flows of a fluid through the heating furnace of the invention.

The first object indicated may be achieved according to a first aspect of this invention, which provides a multi-stage heating furnace for drying a plurality of large-sized substrates arranged in a stack, the multi-stage heating furnace comprising:

a furnace body; and a plurality of shelf heaters arranged within the furnace body such that the shelf heaters are spaced from each other in a vertical direction at a predetermined spacing pitch and such that adjacent ones of the shelf heaters partially define a plurality of drying chambers for accommodating the plurality of large-sized substrates, respectively, each of said plurality of shelf heaters consisting of a far-infrared-radiation panel heater of double-side heating type including a heat radiating plate in which a heat-generating body is embedded, the panel heater having opposite major surfaces covered with respective thin ceramic layers which emit a far infrared radiation when the heat radiating plate is heated by energization of the heat-generating body.

In the multi-phase heating furnace constructed according to the first aspect of this invention, each of the shelf heaters arranged within the furnace body in vertically spaced-apart relation with each other includes a heat radiating plate incorporating a heat-generating body, and has opposite major surfaces covered with respective thin ceramic layers for emitting a far infrared radiation, so that heat is radiated on the opposite sides of each panel heater. The electric wires and terminals for energizing the heat-generating body may be accommodated in the peripheral portion of the panel heater.

The shelf heaters consisting of the respective panel heaters thus constructed are spaced apart from each other within the furnace body, so as to partially define the drying chambers. In operation of the heating furnace, the large-sized substrates are placed on the respective shelf heaters, via suitable support blocks, so that each substrate is heated concurrently on its opposite sides, by radiation heating by the adjacent shelf heaters, whereby the substrates are suitably dried. Owing to the arrangement of the shelf heaters consisting of the double-sided far-infrared-radiation panel heaters in the vertically spaced-apart relation with each other within the furnace body, the space required for installing the present multi-stage heating furnace is significantly reduced with respect to that of a conventional tunnel type heating furnace, for drying a given number of large-sized substrates in one drying cycle. Further, each panel heater of the shelf heaters can be made comparatively thin, so that the shelf heaters can be arranged at a relatively small spacing interval or pitch in the vertical direction. Accordingly, the required height of the present multi-stage heating furnace can be reduced.

The present multi-stage heating furnace is capable of heating the large-sized substrates for liquid crystal display (LCD) panels and plasma display panels (PDP), in an atmosphere having a high degree of cleanliness, with a high degree of accuracy of control of the heating temperature, so that the quality of the dried large-sized substrates can be significantly improved. This advantage in the operating performance of the present heating furnace is enjoyed in addition to the above-indicated advantage of the reduced installation space for the heating furnace owing to the multi-stage shelf heaters arranged in the vertical direction within the furnace body.

According to a first preferred form of the first aspect of the invention, the far-infrared-radiation panel heater further includes a cover plate disposed above the heat radiating plate, and the outer surface of the heat radiating plate and the outer surface of the cover plate are covered with the thin ceramic layers for emitting the far infrared radiation.

According to a second preferred form of the first aspect of the invention, the heat-generating body embedded in the heat radiating plate consists of a plurality of heating portions located in respective different temperature control zones which are arranged in a horizontal direction in which the large-sized substrates are introduced into and removed from the furnace body, the plurality of heating portions being arranged to heat corresponding portions of the heat radiating plates to respective different temperatures that are determined to establish a substantially even distribution of a temperature over a substantially entire surface area of each of the large-sized substrates.

In the heating furnace according to the second preferred form of the invention described above, the temperature at each large-sized substrate can be substantially evenly distributed over the entire surface area of the substrate, owing to the different heating temperatures in the local portions of the heat radiating plate which corresponds to the respective different temperature control zones of the heat-generating body embedded in the heat radiating plate extending in the horizontal direction. The temperature control zones are arranged in the horizontal direction in which the substrates are introduced into and removed from the furnace body.

The heating furnace according to a third preferred form of the invention further comprises a pair of side heaters which are disposed as auxiliary heaters on opposite sides of a stack of the shelf heaters, so as to extend in the vertical direction along opposite side walls of the furnace body, each of the side heaters consisting of a far-infrared-radiation panel heater.

In the heating furnace according to the third preferred form of the invention described above, the accuracy of control of the temperature at the large-sized substrates can be further improved owing to the side heaters which extend vertically along the respective side walls of the furnace body, so as to heat the peripheral portion of each large-sized substrate in the corresponding drying chamber. The heating furnace may further comprise a rear heater disposed vertically along a rear wall of the furnace body.

The heating furnace according to a fourth preferred form of the invention further comprises at least one bottom heater consisting of a far-infrared-radiation heater which cooperates with a lowest one of the shelf heaters to define at least one bottom dummy drying chamber, and at least one top heater consisting of a far-infrared-radiation heater which cooperates with an uppermost one of the shelf heaters to define at least one top dummy drying chamber, none of the large-sized substrates being accommodated in the bottom and top dummy drying chambers in operation of the multi-stage heating furnace.

In the heating furnace according to the fourth preferred form of the invention described above, the temperatures in the lowermost and uppermost drying chambers can be controlled to be equal or close to those in the vertically intermediate drying chambers, in the presence of the bottom and top dummy drying chambers, which function to compensate for a difference between the temperatures in the lowermost and uppermost drying chambers and the temperatures in the vertically intermediate drying chambers, so that the temperatures at the large-sized substrates to be dried in the lowermost and uppermost drying chambers can be controlled with a higher degree of accuracy.

The second object indicated above may be achieved according to a second aspect of this invention, which provides a far-infrared-radiation panel heater of double-side heating type used in a multi-stage heating furnace for drying a plurality of large-sized substrates arranged in a stack within a furnace body, the far-infrared-radiation panel heater comprising:

a heat radiating plate in which a heat-generating body is embedded; and two thin ceramic layers which covers opposite major surfaces of the panel heater and emit a far infrared radiation when the heat radiating plate is heated by energization of the heat-generating body.

According to a first preferred form of the second aspect of this invention, the far-infrared-radiation panel heater of double-side heating type further comprises a cover plate disposed above the heat radiating plate, the two thin ceramic layers covers an outer surface of the heat radiating plate and an outer surface of the cover plate, respectively.

According to a second preferred form of the second aspect of the invention, the far-infrared-radiation panel heater of double-side heating type further comprises a hollow frame structure in which the heat radiating plate is fixedly fitted over an entire periphery thereof, the heat radiating plate partially defining a fluid passage communicating with an interior of the hollow frame structure, the heat radiating plate having a multiplicity of blow holes communicating with the fluid passage and open in an outer surface thereof, for fluid communication between the fluid passage and a space outside the panel heater.

The third object indicated above may be achieved according to a third aspect of this invention, which provides a method of controlling flows of a fluid through a multi-stage heating furnace constructed according to the first aspect of this invention, the method comprising the steps of:

blowing a fluid downwards from a lower surface of each of the plurality of shelf heaters, into an internal space within the furnace body, through blow holes open in the above-indicated lower surface;

discharging the fluid from the space into an external space outside the furnace body, by suction through suction holes formed for fluid communication between the internal and external spaces through the furnace body.

In the fluid control method according to the third aspect of this invention described above, the fluid such as air is blown downwards from the lower surface of each shelf heater into the internal space of the furnace body, through the blow holes formed through the shelf heater, and is discharged into the external space outside the furnace body, by suction through the suction holes formed through the furnace body. According to this arrangement, the fluid is pre-heated by the shelf heater before it is blown into the internal space the furnace body, so that the temperature distribution at the upper surface of each substrate is not undesirably influenced by the blown fluid. Accordingly, solvents evaporated from the substrate under drying, and the heat generated within the furnace body are discharged or dissipated into the external space, whereby the atmosphere within the furnace body is kept considerably clean, and the substrate is effectively dried by the flows of the fluid.

According to a preferred form of the third aspect of the invention, the above-indicated step of discharging the fluid comprises forming the suction holes through a pair of side heaters disposed on respective inner surfaces of opposite side walls of the furnace body. In this arrangement, the fluid blown into the internal space can be effectively discharged into the external space through the suction holes formed through the side heaters, under the aid of suction through the suction holes connected to a suitable sucking device such as an exhaust fan.

BRIEF DESCRIPTION OF THE DRAWINGS

The above and other objects, features, advantages and technical and industrial significance of the present invention will be better understood by reading the following detailed description of a presently preferred embodiment of the invention, when considered in connection with the accompanying drawings, in which.

DETAILED DESCRIPTION OF THE PREFERRED EMBODIMENTS

Referring first to the side and front elevational view of FIGS. 1 and 2 and the plan view of FIG. 3, there will be described a multi-stage heating furnace constructed according to one embodiment of the present invention. The multi-stage heating furnace is constructed to dry and heat large-sized substrates V used for a liquid crystal display (LCD) panel and a plasma display panel (PDP). For drying and heating the large-sized substrates V for the liquid crystal display panel, the heating furnace may be used as a furnace for firing orientation films of the display panel or drying sealing members of the display panel. For drying and heating the large-sized substrates V for the plasma display panel, the heating furnace may be used as a furnace for drying masses of various coating pastes (used for forming ribs, electrodes, sealing members, and fluorescent bodies, for example). The heating furnace has a body A in which a plurality of shelf heaters H1–H6 are disposed so as to extend in the horizontal direction such that the shelf heaters H1-H6 are spaced from each other in the vertical direction, at a predetermined spacing pitch P. Each of the shelf heaters H1–H6 is constituted by a far-infrared-radiation panel heater of double-side heating type.

Figure 1:
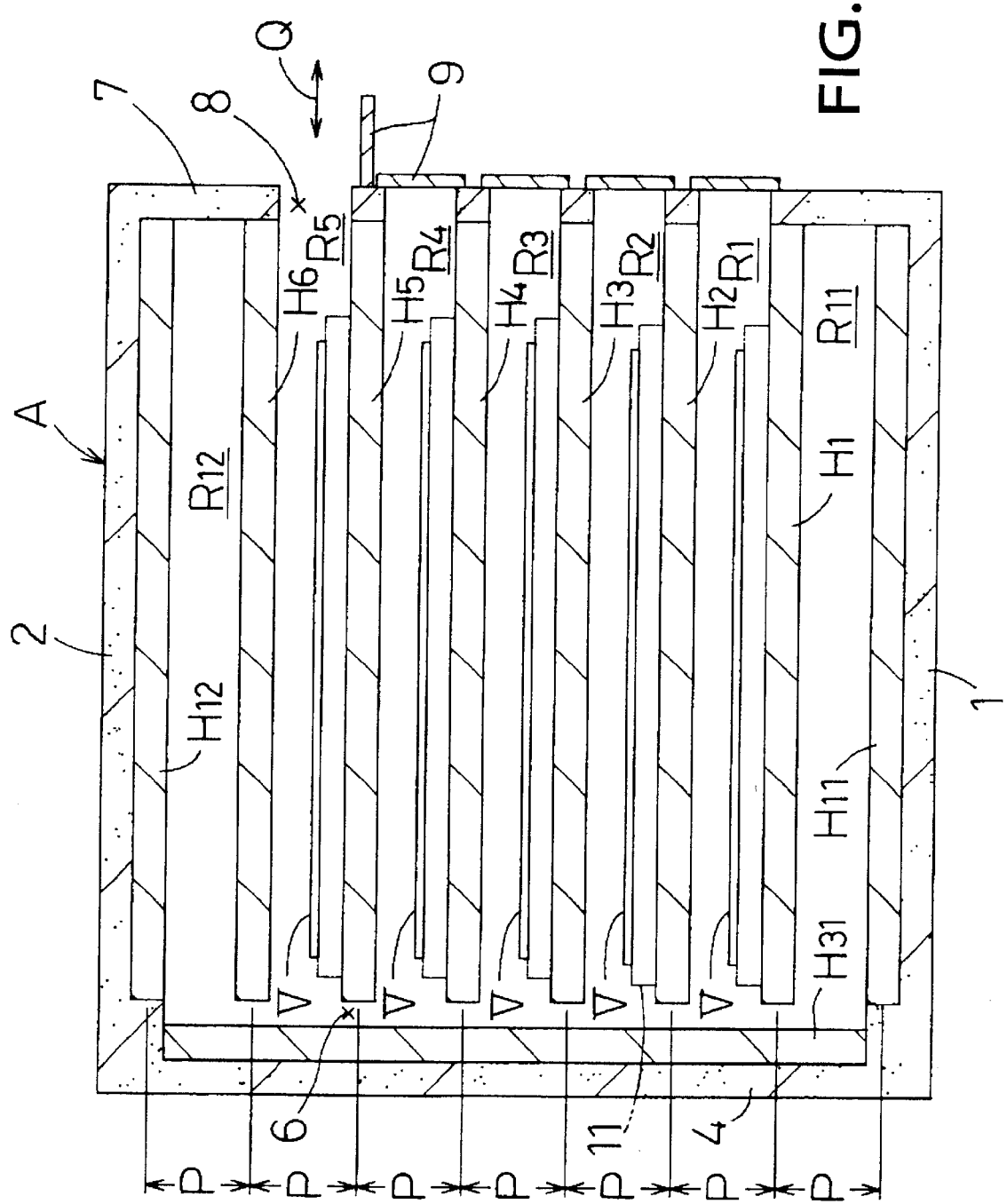
FIG. 1 is a side elevational view in cross section of a multi-stage heating furnace according to an embodiment of this invention.
Figure 2:
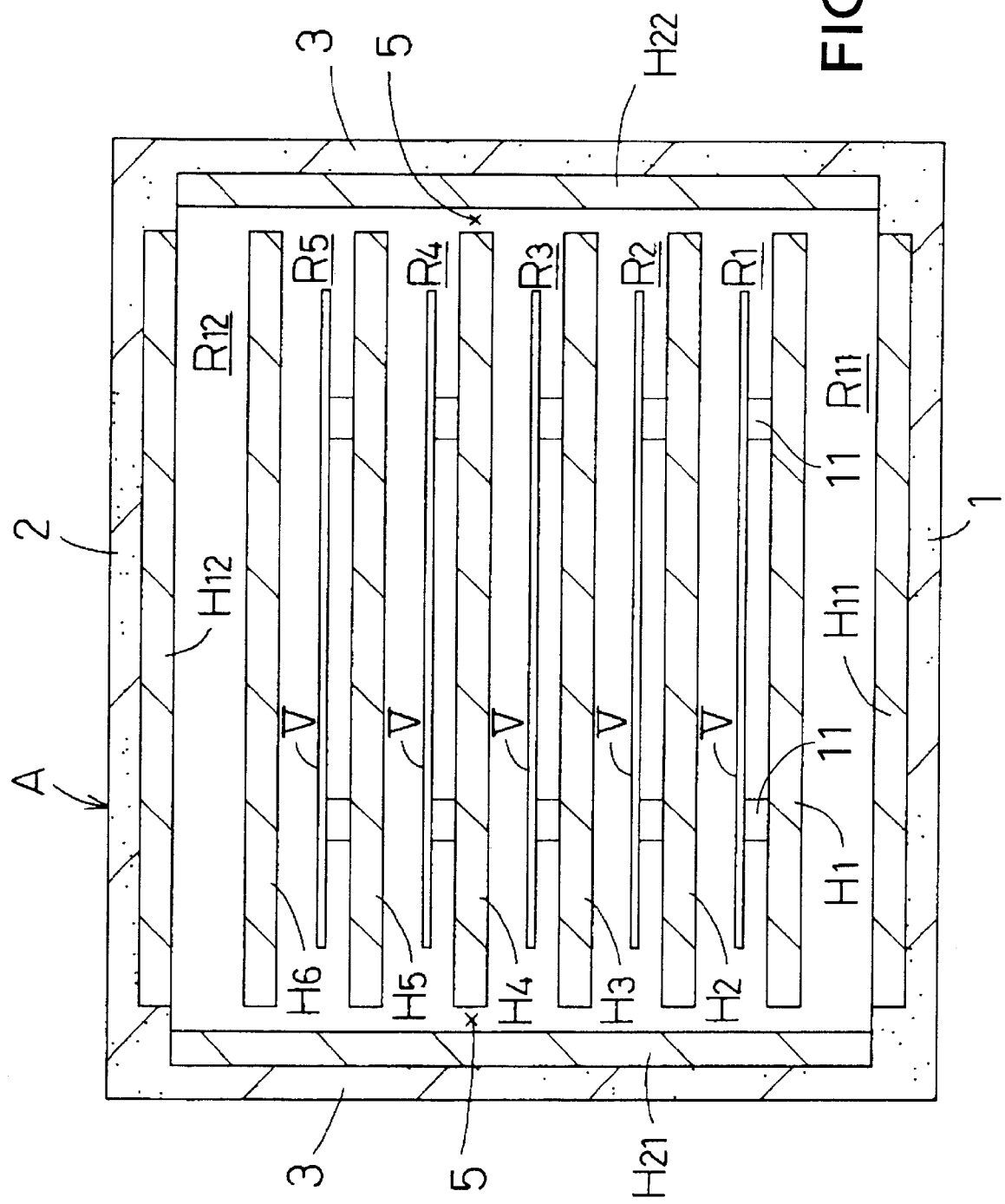
FIG. 2 is a front elevational view in cross section of the heating furnace of FIG. 1.
Figure 3:
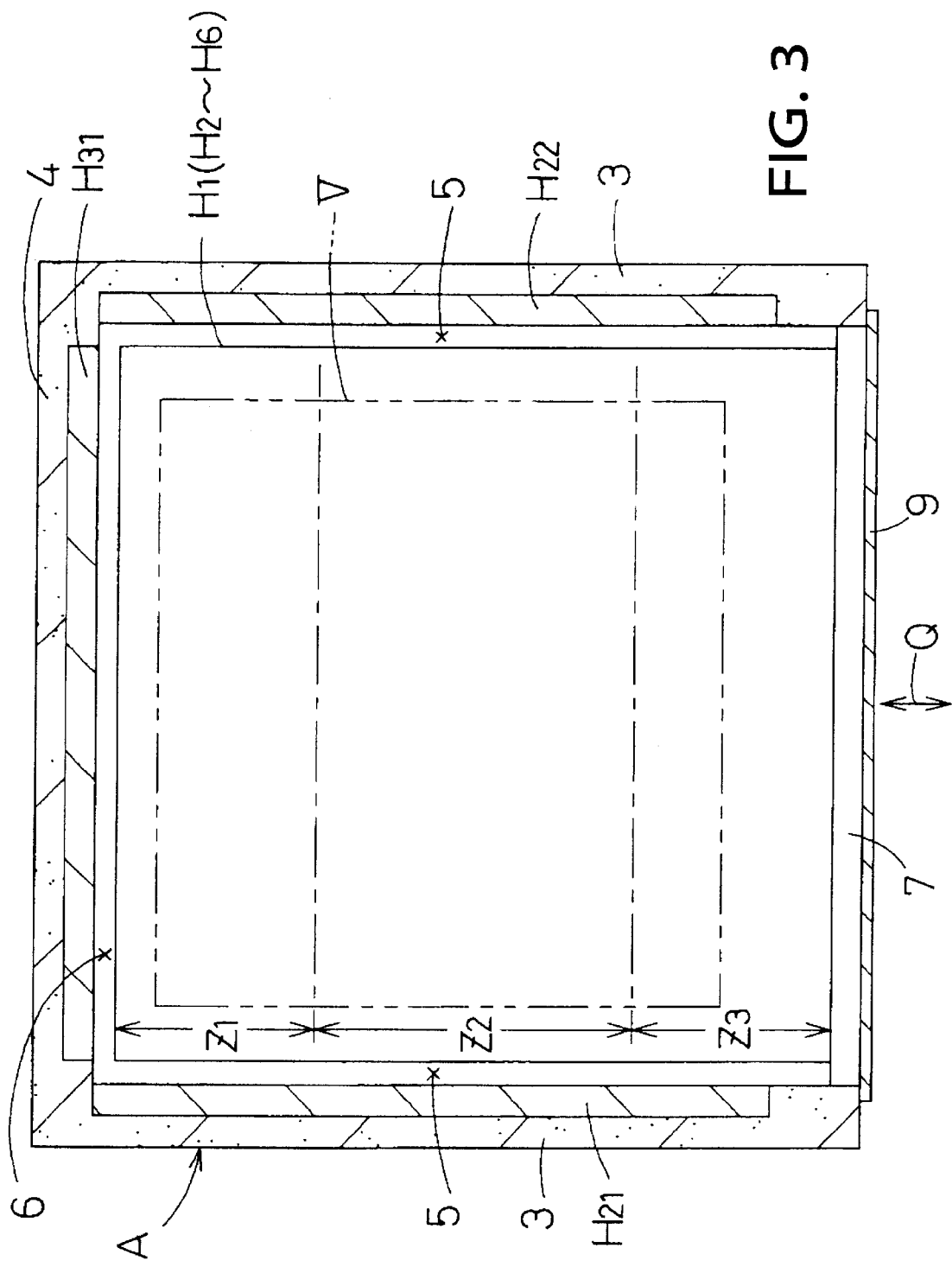
FIG. 3 is a plan view of the heating furnace.

The furnace body A further incorporates a bottom heater H11, a top heater H12, two side heaters H21, H22, and a rear heater H31, as shown in FIGS. 1–3. Each of these heaters H11, H12, H21, H22, H31 is also constituted by the far-infrared-radiation panel heater of double-side heating type. The bottom heater H11 is disposed on an inner surface of a bottom wall 1 of the furnace body A, which is located right under the lowermost shelf heater H1, while the top heater H12 is disposed on an inner surface of a top wall 2 of the furnace body A, which is located right above the uppermost shelf heater H6, as shown in FIG. 1. The bottom and top heaters H11, H12 are vertically spaced from the respective lowermost and uppermost shelf heaters H1, H6 by a distance equal to the spacing pitch P indicated above. The two side heaters H21, H22 are disposed on inner surfaces of respective side walls 3, 4 of the furnace body A, so as to extend in the vertical direction, as shown in FIGS. 2 and 3, while the rear heater H31 is disposed on an inner surface of a rear wall 4 of the furnace body A, so as to extend in the vertical direction, as shown in FIGS. 1 and 3.

In the furnace body A, there are provided air flow gaps 5, 5 between the shelf heaters H1–H6 and the respective two side heaters H21, H22, and an air gap 6 between the shelf heaters H1–H6 and the rear heater H31, as shown in FIGS. 1–3. The spacing pitch P of the multi-stage shelf heaters H1–H6 and bottom and top heaters H11, H12 in the vertical direction is suitably determined on the basis of the size of the large-sized substrates V, and a method of introducing and removing the substrates V into and from the furnace body A, more specifically, into and from drying chambers R1–R5 which are defined by and between the adjacent shelf heaters H1–H6. Each of the shelf heaters H1–H6 is supported at one end by a front wall 7 of the furnace body A, and at the two corner portions at the opposite end by respective projections from the rear wall 4.

As indicated above, the drying chambers R1–R5 are defined by and between the two adjacent ones of the multi-stage shelf heaters H1–H6 which are spaced from each other at the predetermined spacing pitch P. Further, a lower dummy drying chamber R11 is defined by and between the lowermost shelf heater H1 and the bottom heater H11, while an upper dummy drying chamber R12 is defined by and between the uppermost shelf heater H6 and the top heater H12. The drying chambers R1–R5 have respective entrances 8 formed through the front wall 7 of the furnace body A, so that the substrates A are introduced and removed into and from the respective drying chambers R1–R5, before and after the drying of the substrates A, respectively. The entrances 8 are spaced from each other in the vertical direction at the predetermined spacing pitch P indicated above. Each of the entrances 8 has a rectangular shape, extending in the horizontal direction, and is provided with a hinged door 9 pivotable about a horizontally extending axis, as shown in FIG. 1, so that the entrance 8 is closed and opened by the hinged door 9.

On the upper surface of each of the shelf heaters H1–H6, there are disposed a pair of support blocks 11, so as to extend in a direction Q in which the substrates V are introduced and removed into and from the drying chambers R1–R5, as shown in FIG. 1. The two support blocks 11 are spaced apart from each other in a direction perpendicular to the direction Q, as indicated in FIG. 1. Each substrate V is placed on the support blocks 11 on the corresponding one of the shelf heaters H1–H6, in a spaced or non-contact relationship with the adjacent shelf heaters H1–H6, so that the substrate V is heated on its opposite sides, by radiation heating by the shelf heaters H1–H6. To prevent or minimize an influence of the external atmosphere on the internal atmosphere within the furnace body A upon opening of the hinged doors 9 which causes the external atmosphere to flow into the drying chambers R1–R5, the substrates V introduced into the respective drying chambers R1–R5 are desirably located nearer to the rear wall 4 than to the front wall 7.

Figure 4:
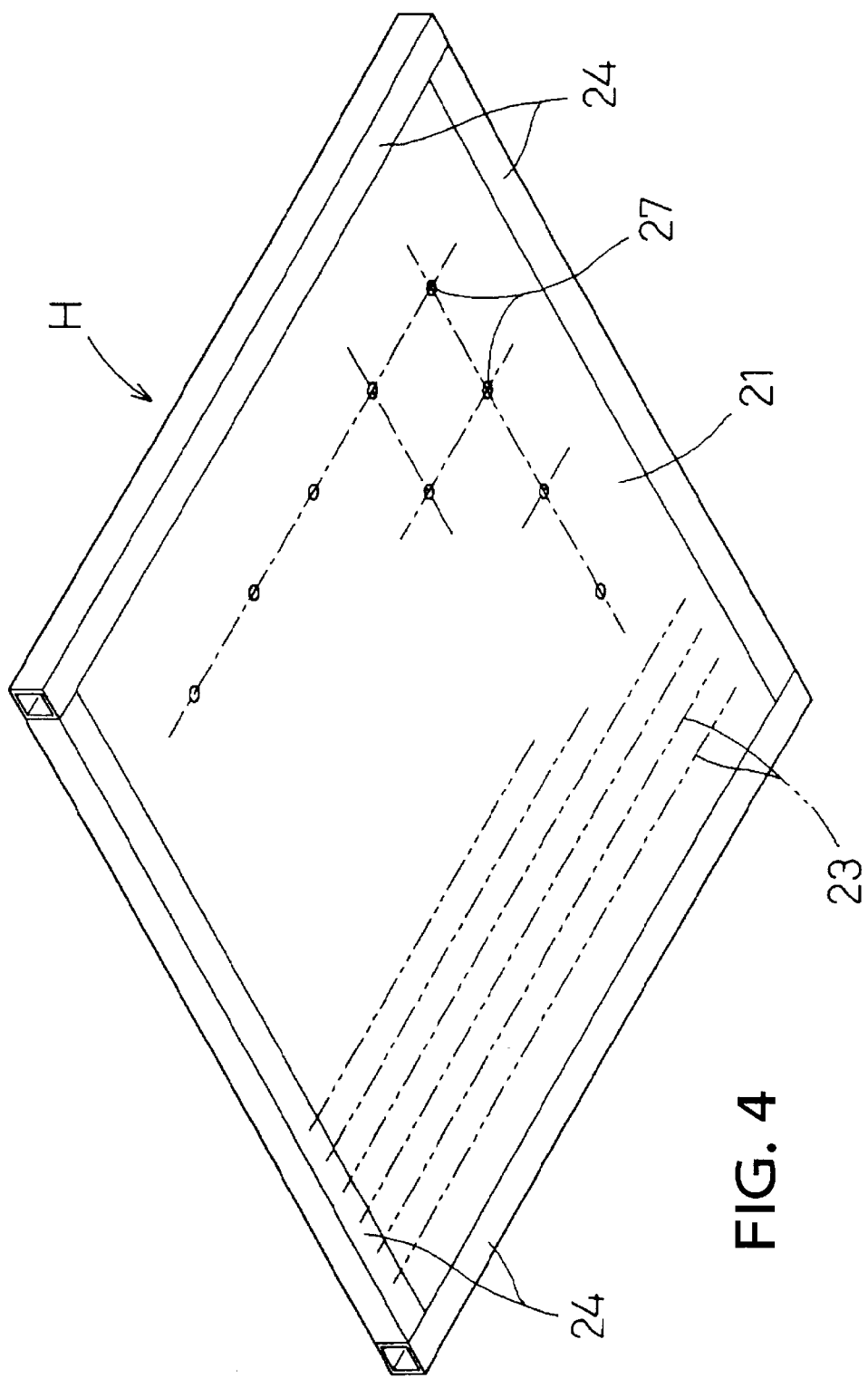
FIG. 4 is a perspective view of a far-infrared-radiation panel heater H as seen from its underside.
Figure 5:
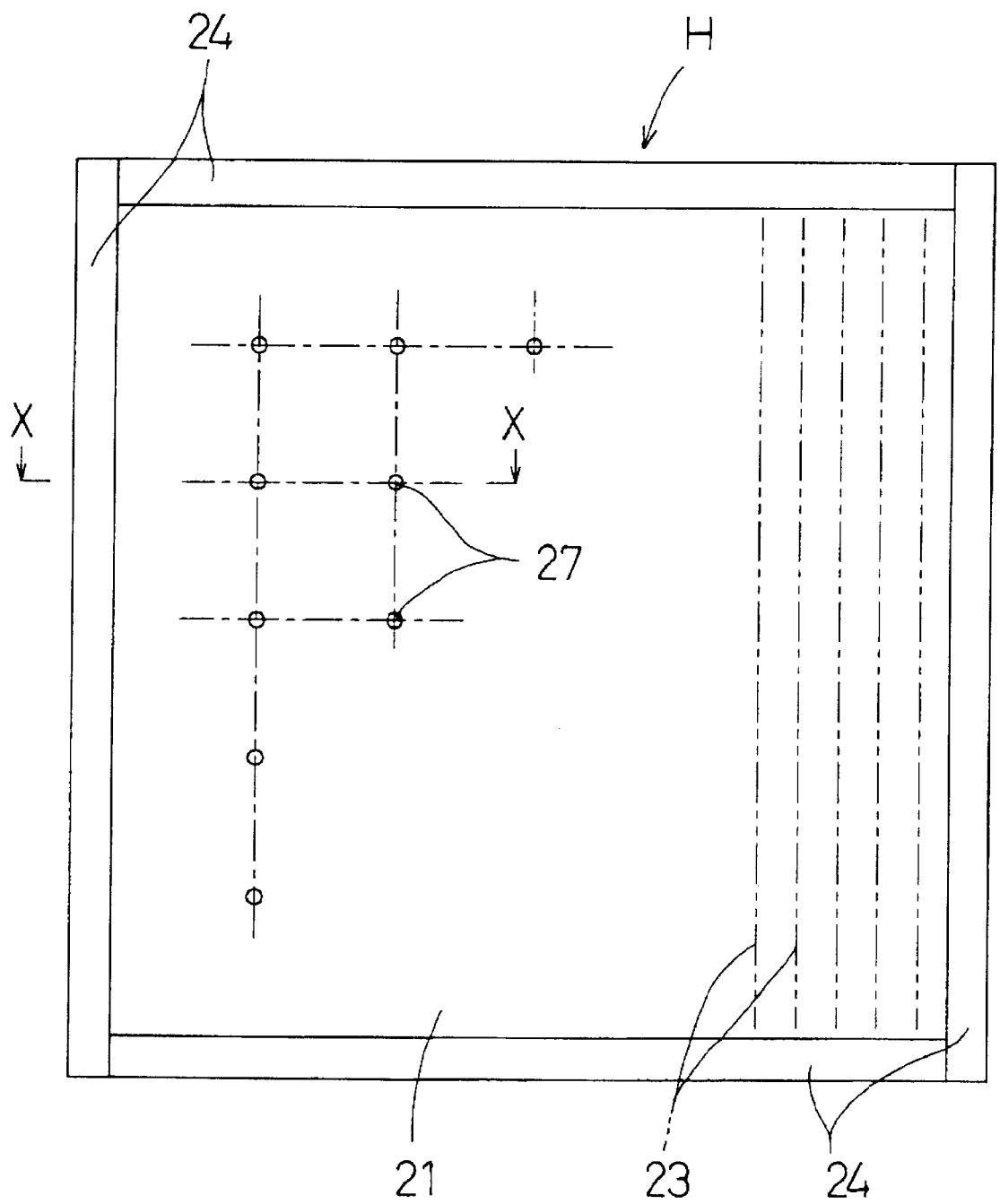
FIG. 5 is a bottom plan view of the panel heater of FIG. 4.
Figure 6:
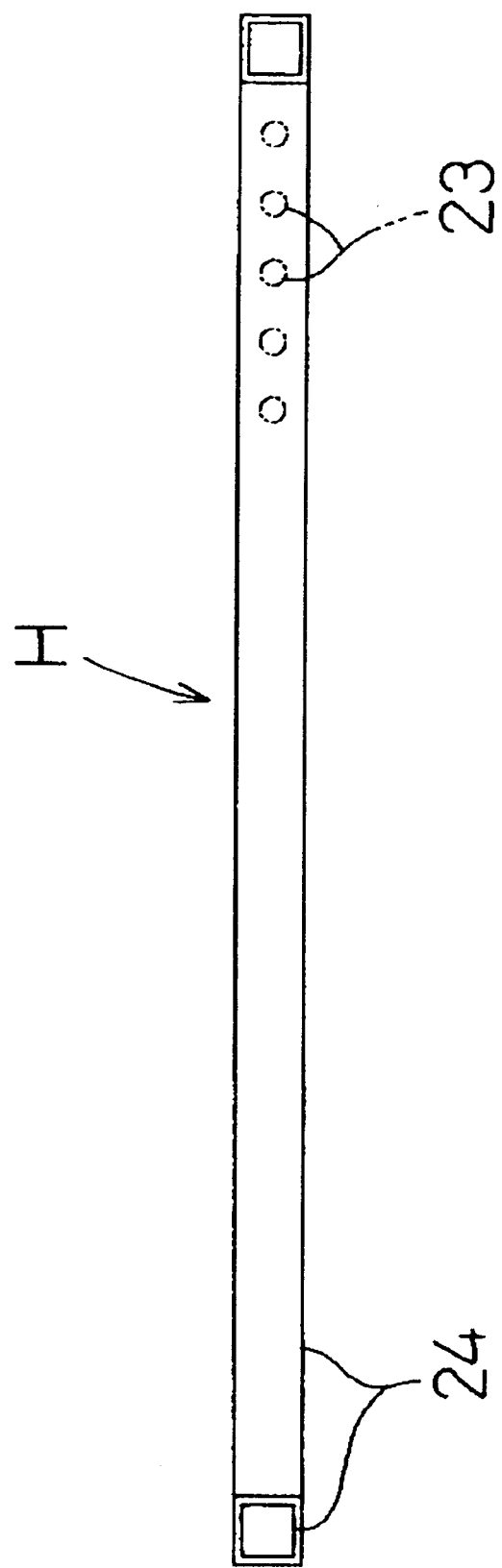
FIG. 6 is a side elevational view of the panel heater.
Figure 7:
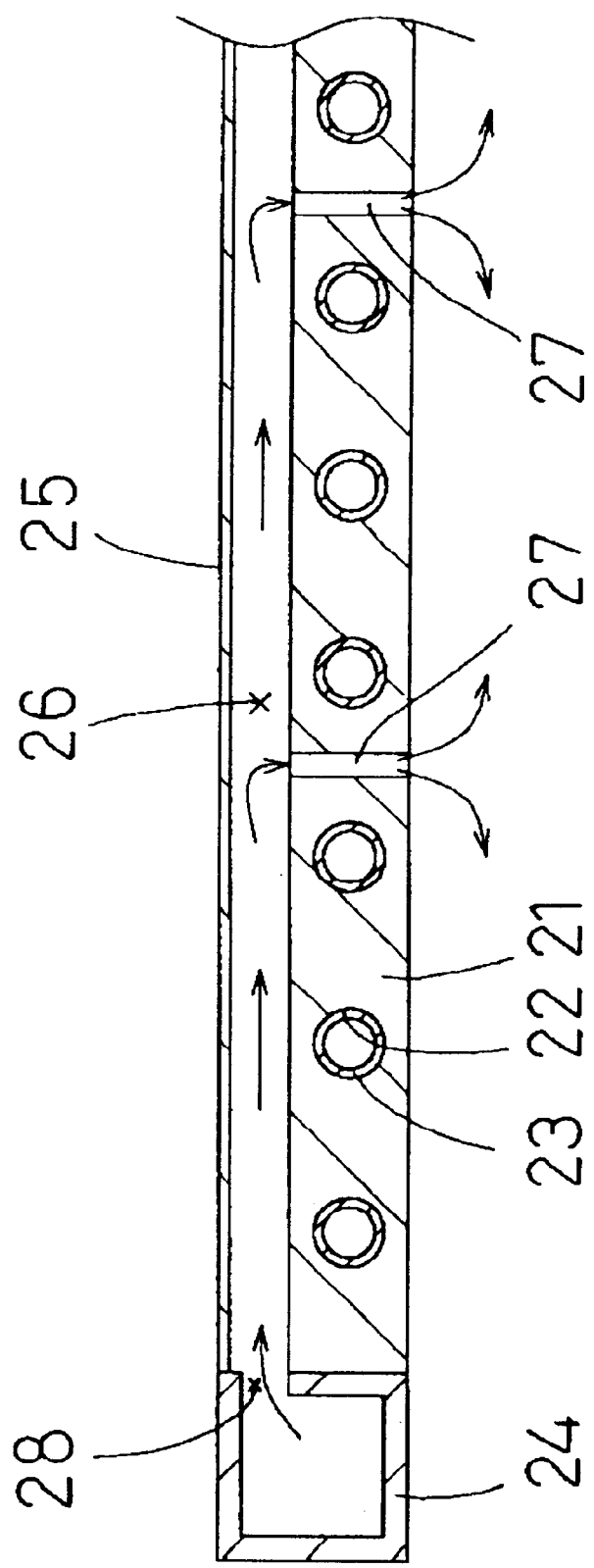
FIG. 7 is an enlarged cross sectional view taken along line X—X of FIG. 5.

Referring next to the perspective view of FIG. 4, bottom plan view of FIG. 5, side elevational view of FIG. 6 and enlarged cross sectional view of FIG. 6, there will be described the far-infrared-radiation panel heater H of double-side heating type used as each of the heaters H1–H6, H11, H12, H21, H31. This far-infrared-radiation panel heater H is a relatively large generally planar rectangular member similar in shape to the large-sized substrate V. The panel heater H includes a heat radiating plate 21, a hollow frame structure 24, and a cover plate 25. The heat radiating plate 21 is a relatively thick rectangular aluminum plate having a multiplicity of pipe holes 22 (FIG. 7) formed therethrough in parallel with a pair of opposite two sides of its rectangle, such that the pipe holes are equally spaced apart from each other in a direction parallel to the other pair of opposite two sides of the rectangle. The heat radiating plate 21 has a heat-generating body in the form of a multiplicity of cylindrical heat-generating members 23 received in the respective pipe holes 22. The hollow frame structure 24 consists of four metallic channel members having a substantially square cross sectional shape as shown in FIG. 7. The four channel members are connected to form a rectangular frame in which the heat radiating plate 21 is fixedly fitted over its entire periphery. The cover plate 25 is a relatively thin rectangular aluminum plate fixedly supported by the surrounding frame structure 24 such that the cover plate 25 is spaced a suitable distance from the upper surface of the heat radiating plate.

The heat radiating plate 21 and the cover plate 25 cooperate to define therebetween an air passage 26, which is held in fluid communication with a multiplicity of air blow holes 27 formed through the entire thickness of the heat radiating plate 21. As shown in FIG. 5, the air blow holes 27 are arranged in a matrix. The frame structure 24 has a primary function of reinforcing the relatively thin heat radiating plate 21 at its peripheral portion, and auxiliary functions of accommodating electric wires and terminals for the heat-generating members 23 and serving as air passages for drawing and expelling or discharging air into and from the furnace body A. The heat-generating members 23 are energized to generate heat, by application of an electric current thereto through the electric wires and terminals indicated above.

In the thus constructed panel heater H, the outer surface of the heat radiating plate 21 and the outer surface of the cover plate 25 are covered by respective thin layers of a suitable ceramic material such as zirconia or alumina capable of emitting a far infrared radiation. These thin layers of ceramic material have a thickness of 0.01–0.2 mm. When the heat radiating plate 21 is subjected to conduction heating by the cylindrical heat-generating members 23 embedded in the plate 21, the cover plate 25 is subjected to radiation heating, so that a far infrared radiation is emitted from the ceramic layers covering the outer surfaces of the heat radiating plate 21 and the cover plate 25, whereby the substrate V opposed to the far-infrared-radiation panel heater H is subjected to radiation heating by the far infrared radiation. In the heating furnace constructed according to the present embodiment of the invention, each substrate V is interposed between the two adjacent shelf heaters H (H1–H6) spaced apart from each other by a suitable spacing distance (P), so that the substrate V is heated at its opposite major surfaces which are opposed to the respective shelf heaters H.

The interior of the rectangular frame structure 24 of each of the shelf heaters H1–H6 serves as the air passages as described above is connected to an air compressor, to introduce compressed air into the drying chambers R1–R5. To this end, the frame structure 24 of each shelf heater H has a plurality of air inlets 28 communicating with the air passage 26 formed between the heat radiating plate 21 and the cover plate 25, as indicated in FIG. 7. According to this arrangement, the compressed air introduced into the frame structure 28 is fed through the air inlets 28 and air passage 26 and is blown downwards from the heat radiating plate 21 (panel heater H1–H6) through the multiple air blow holes 27.

Figure 8:
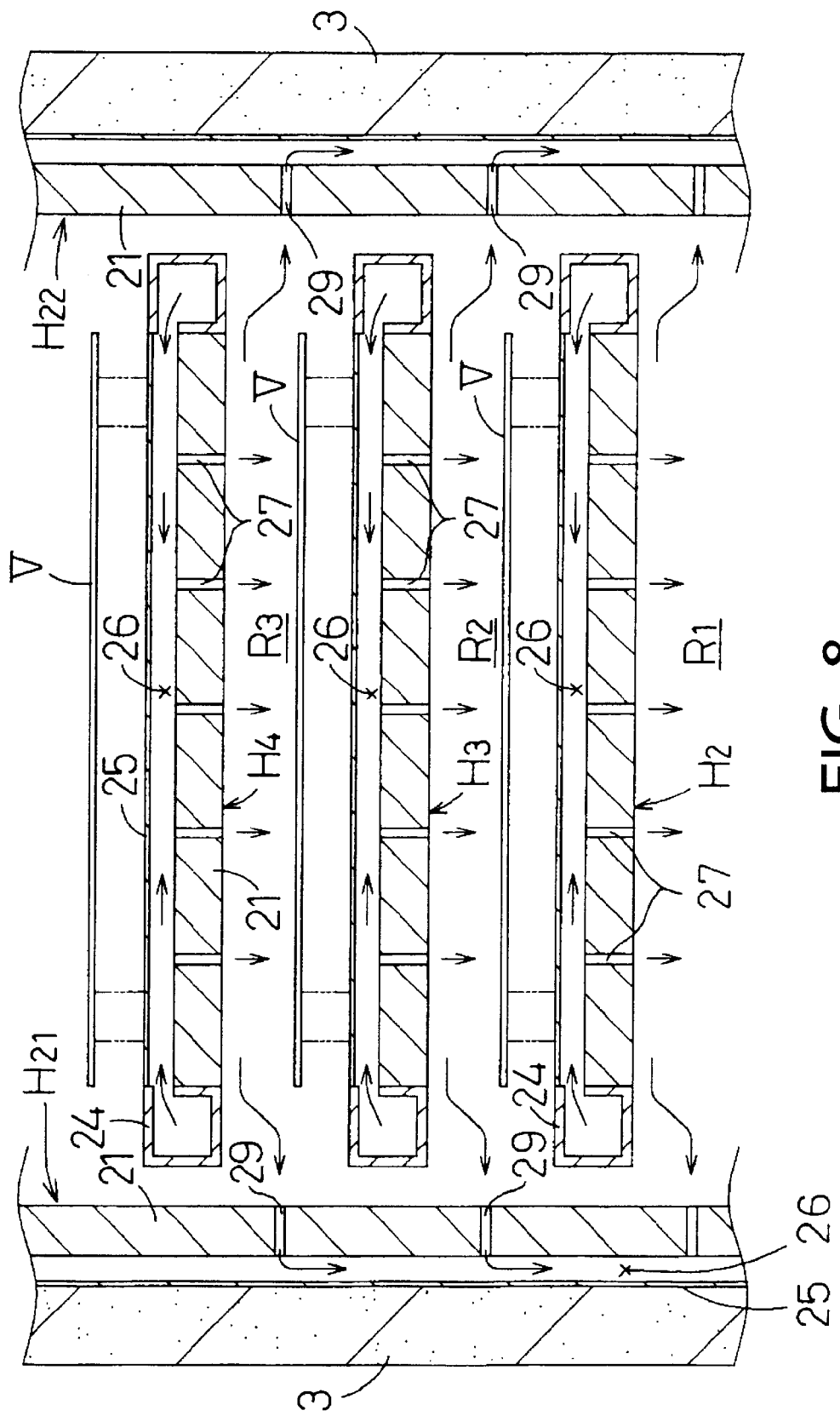
FIG. 8 is a fragmentary front elevational view in cross section of the heating furnace of FIGS. 1–3 indicating air flows within a furnace body A.

On the other hand, the interior of the frame structure 24 of each of the side and rear heaters H21, H22, H31 which extend in the vertical direction is connected to a suitable exhaust fan through an exhaust duct, and the heat radiating plate 21 of these heaters H21, H22, H31 has a multiplicity of suction holes 29 formed through its entire thickness, as shown in the fragmentary cross sectional view of FIG. 8. The suction holes 29 are held in communication with the drying chambers R1–R5 and the air passage 26.

In the shelf heaters H1–H6 and bottom and top heaters H11, H12 installed in place within the furnace body A, the cylindrical heat-generating members 23 accommodated within the heat radiating plate 21 extend in the direction perpendicular to the direction Q of movements of the substrates V into and out of the furnace body A. These heat-generating members 23 of each heaters H1–H6, H11, H12 consist of three groups located in respective three temperature control zones Z1–Z3 which are arranged in the direction Q, as indicated in FIG. 3. The heating temperatures of the three groups of heat-generating members 23 in the respective temperature control zones Z1–Z3 are controlled independently of each other, so as to compensate for a variation in the heating temperature in each of the drying chambers R1–R5, which would otherwise take place due to the external atmosphere introduced into the drying chambers R1–R5 when the entrances 8 are opened. This control arrangement assures substantially even distribution of the heating temperature within the furnace body A in the direction Q, namely, in the direction parallel to the side walls 3.

In operation of the heating furnace, the large-sized substrates V are introduced into the respective drying chambers R1–R6 through the respective entrances 8 provided in the front wall 7, and are placed on the pair of support blocks 11 on the respective shelf heaters H1–H5, in spaced-apart relationship from the adjacent shelf heaters H1–H6, as shown in FIGS. 1–3, such that the printed surface of each substrate V faces upwards. The substrate V thus positioned in each of the drying chambers R1–R6 is subjected at its opposite surfaces to the primary radiation heating by the upper and lower shelf heaters H1–H6, and is subjected at its peripheral portion to the auxiliary radiation heating by the side and rear heaters H21, H22 and H31. These primary radiation heating and auxiliary radiation heating are particularly effective to heat the upper surfaces of the substrates V. The substrates thus dried are removed from the drying chambers R1–R6 through the entrances 8, by opening the hinged doors 9.

The lower dummy drying chamber R11 formed below the lowermost shelf heater H1 and the upper dummy drying chamber R12 formed above the uppermost shelf heater H6 are not provided with the entrances 8 and hinged doors 9. Like each of the normal drying chambers R1–R5, each of the lower and upper dummy drying chambers R11, R12 is defined by and between the two adjacent heaters. Namely, the lower dummy drying chamber R11 is defined by and between the lowermost shelf heater H1 and the bottom heater H11 located under the shelf heater H1, while the upper dummy drying chamber R12 is defined by and between the uppermost shelf heater H6 and the top heater H12 located above the shelf heater H6. The provision of these dummy drying chambers R11, R12 adjacent to the lowermost and uppermost normal drying chambers R1, R5 permits the heating temperatures in the lowermost and uppermost drying chambers R1, R5 to be substantially equal to those in the intermediate normal drying chambers R2–R4, so that the temperatures at the surfaces of the substrates V in the lowermost and uppermost drying chambers R1, R5 can be controlled with sufficiently high accuracy. The bottom and top heaters H11, H12, which are also far-infrared-radiation heaters of double-side heating type, are disposed in close contact with the inner surfaces of the bottom and top walls 1, 2 of the furnace body A, so that heat is less likely to be dissipated in the dummy drying chambers R11, R12, whereby the temperatures in these dummy drying chambers R11, R12 are higher than in the normal drying chambers R1–R5. Accordingly, the dummy drying chambers R11, R12 do not permit even distribution of the heating temperature in the direction of thickness of the substrates V.

Thus, the large-sized substrates V supported by the shelf heaters H1–H6 except the uppermost shelf heater H6, that is, by the respective shelf heaters H1–H5 are heated in substantially all directions by radiation heating. Further, the lower and upper dummy drying chambers R11, R12 permit substantially even or uniform temperature distribution at the surfaces of the substrates V, throughout the interior space of the furnace body A, namely, in all of the drying chambers R1–R5, so that the heating temperature can be accurately controlled for all of the substrates V. An experiment revealed a temperature variation of as small as ±1.5° C., where the nominal temperature to be established within the furnace body A was within a range of 100–250° C.

In addition, the hot air is blown downwards from the horizontally extending shelf heaters H1–H6 and the top heater H12 into the furnace body A, while the thus blown hot air is sucked into the vertically extending side and rear heaters H21, H22, H31, as indicated in FIG. 8. Described more specifically, the air introduced into the frame structure 24 of each of the shelf heaters H1–H6 and top heater H12 is fed through the air inlets 28 into the air passage 26 between the heat radiating plate 21 and the cover plate 25, so that the air is heated by the shelf and top heaters H1–H6, H12 to a suitable temperature value. The thus heated air or hot air is blown downwards from the heaters H1–H6, H12 through the air blow holes 27 formed through the heat radiating plate 21, so that the upper surface of the underlying substrate V is heated by the hot air. The hot air then flows along the upper surface of the substrate V, toward the suction holes 29 formed through the side heaters H21, H22 and rear heater H31, under the aid of suction by the exhaust fan connected to the suction holes 29 through the exhaust duct. It is noted that the dimensions of the heaters H1–H6, H21, H22 in the cross sectional view of FIG. 8 are made different from those in the cross sectional view of FIG. 2, for easier illustration of the air flows within the furnace body A.

With the air flows described above, the solvents evaporated from the printed portion of each substrate V under drying, and the heat generated within the furnace body A are discharged or dissipated into the atmosphere outside the furnace body A, so that the atmosphere within the furnace body A is kept considerably clean, and the substrate V is effectively dried by the flows of the air along the upper surface of the substrate V. In addition, since the air is pre-heated by the shelf and top heaters H1–H6, H12 before it is blown through the air blow holes 27, the temperature distribution at the upper surface of each substrate V is not undesirably influenced by the blown air. It is also noted that the present multi-stage heating furnace does not include any conveying device or mechanism for moving the substrates V into and from the furnace body A. This absence of any conveying device permits an improvement of the cleanliness degree of the atmosphere within the furnace body A, to Class 100 or so, in combination with the removal of the evaporated solvents from the furnace body A together with the pre-heated air blown downwards from each of the shelf heaters H1–H6 and top heater H12.

The space required for installation of the present multi-stage heating furnace can be reduced to one tenth of that of a conventional tunnel furnace, since the heating capacity of the present heating furnace (the number of the substrates to be dried in one operation) can be increased by increasing the number of the drying chambers R (the number of the shelf heaters), which merely increases the height of the furnace body A. Further, the present multi-stage heating furnace uses the panel heaters H of double-side heating type wherein the electric wires and terminals for the heat-generating members 23 are accommodated in the frame structure 24. The panel heaters H of this double-side heating type have a considerably smaller thickness than a conventional heater of single-side heating type, and can be arranged at a vertically spacing pitch of as small as about 50–150 mm, contrary to the pitch of as large as about 400–600 mm of the single-side heating type. Accordingly, the required height of the present multi-stage heating furnace can be reduced.

In the illustrated embodiment described above, each far-infrared-radiation panel heater of double-side heating type uses a heat-generating body in the form of the multiplicity of cylindrical heat-generating members 23 embedded in the aluminum heat radiating plate 21 at the predetermined spacing pitch. However, the far-infrared-radiation panel heater of double-side heating type used in the multi-stage heating furnace may use any other heat-generating body, for instance, suitably patterned layers of an electrically resistive metal formed on an electrically insulating sheet formed of polyimide or mica, for example. In this case, each patterned layer of the electrically resistive metal desirably consists of a plurality of temperature control zones which are arranged in the direction Q and which have different electric resistance values so that the temperature control zones have different thermal output values, for even distribution of the heating temperature for the substrate V in the direction Q. Although the illustrated embodiment is arranged to introduce and discharge air into and from the furnace body A so as to improve the cleanliness of the atmosphere within the furnace body A, any other gaseous fluid such as nitrogen gas or other inert gas which does not oxidize the substrates V may be used.

In the illustrated embodiment, the air blown downwards from the multi-stage shelf heaters H1–H6 to improve the cleanliness of the atmosphere within the furnace body A are discharged from the furnace body A by suction through the suction holes 29 and air passages 26 formed through the side and rear heaters H21, H22, H31. However, these side and rear heaters H21, H22, H31 are not essential and may be replaced by suction holes which are directly formed through the side and rear walls 2, 4 of the furnace body A.

While the upper and lower surfaces of each shelf heater H1–H6 are both coated with the ceramic layer emitting a far infrared radiation in the illustrated embodiment, the ceramic layer on the upper surface of the shelf heater may be dispensed with where the heating temperature at the lower surface of the substrate V is required to be controlled to a relatively low level.

The heating furnace of the illustrated embodiment has only one entrance 8 at one end of each drying chamber R1–R5 so that the substrate V is introduced into and removed from the drying chamber through the same entrance 8 before and after the drying of the substrate V. However, each drying chamber may be provided at one end with an inlet open end through which the substrate V is introduced before the drying, and at the other end with an exit open end through which the substrate V is removed after the drying.

In the illustrated embodiment, the interior of the frame structure 24 of each of the shelf heaters H1–H6 is connected to the air compressor so that compressed air is blown downwards through the air blow holes 27, while the interior of the frame structure 24 of each of the side and rear heaters H21, H22, H31 is connected to the exhaust fan so that the air is discharged from the furnace body A through the suction holes 29. However, the compressed air may be introduced through the holes 29 of the side and rear heaters H21, H22, H31. In this case, the air is discharged through the holes 37 of the shelf heaters H1–H6.

While the six shelf heaters H1–H6 are provided to define the five drying chambers R1–R5 in the illustrated embodiment, the numbers of the shelf heaters and drying chambers may be suitably determined depending upon the desired number of the large-sized substrates A to be processed in one drying cycle.

It is to be understood that the present invention may be embodied with various other changes, modifications and improvements, which may occur to those skilled in the art, without departing from the spirit and scope of the invention defined in the following claims.

What is claimed is:

1. A multi-stage heating furnace for drying a plurality of large-sized substrates arranged in a stack, comprising:
   a furnace body; and
   a plurality of shelf heaters arranged within said furnace body such that said shelf heaters are spaced from each other in a vertical direction at a predetermined spacing pitch and such that adjacent ones of said shelf heaters partially define a plurality of drying chambers for accommodating said plurality of large-sized substrates, respectively, each of said plurality of shelf heaters comprising a far-infrared-radiation panel heater of double-side heating type including a heat radiating plate in which a heat-generating body is embedded, said heat radiating plate partially defining a fluid passage and having a multiplicity of blow holes communicating with said fluid passage and open in an outer surface thereof, for fluid communication between said fluid passage and a space outside said panel heater, said panel heater having opposite major surfaces covered with respective thin ceramic layers which emit a far infrared radiation when said heat radiating plate is heated by energization of said heat-generating body.

2. A multi-stage heating furnace according to claim 1, wherein said far-infrared-radiation panel heater further includes a cover plate disposed above said heat radiating plate, said opposite major surfaces of said panel heater comprising an outer surface of said heat radiating plate and an outer surface of said cover plate.

3. A multi-stage heating furnace according to claim 1, wherein said heat-generating body embedded in said heat radiating plate comprises a plurality of heating portions located in respective different temperature control zones which are arranged in a horizontal direction in which said large-sized substrates are introduced into and removed from said furnace body, said plurality of heating portions being arranged to heat corresponding portions of said heat radiating plates to respective different temperatures that are determined to establish a substantially even distribution of a temperature over a substantially entire surface area of each of said large-sized substrates.

4. A multi-stage heating furnace according to claim 1, further comprising a pair of side heaters which are disposed as auxiliary heaters on opposite sides of a stack of said plurality of shelf heaters, so as to extend in said vertical direction along opposite side walls of said furnace body, each of said side heaters comprising a far-infraredradiation panel heater.

5. A multi-stage heating furnace according claim 1, further comprising at least one bottom heater comprising a far-infrared-radiation heater which cooperates with a lowest one of said plurality of shelf heaters to define at least one bottom dummy drying chamber, and at least one top heater comprising a far-infrared-radiation heater which cooperates with an uppermost one of said plurality of shelf heaters to define at least one top dummy drying chamber, none of said plurality of large-sized substrates being accommodated in said at least one bottom dummy drying chamber and said at least one top dummy drying chamber in operation of said multi-stage heating furnace.

6. A far-infrared-radiation panel heater of double-side heating type used in a multi-stage heating furnace for drying a plurality of large-sized substrates arranged in a stack within a furnace body, said far-infrared-radiation panel heater comprising:
   a heat radiating plate in which a heat-generating body is embedded, said heat radiating plate partially defining a fluid passage and having a multiplicity of blow holes communicating with said fluid passage and open in an outer surface thereof, for fluid communication between said fluid passage and a space outside said panel heater; and
   two thin ceramic layers which cover opposite major surfaces of said panel heater and emit a far infrared radiation when said heat radiating plate is heated by energization of said heat-generating body.

7. A far-infrared-radiation panel heater of double-side heating type according to claim 6, further comprising a cover plate disposed above said heat radiating plate, said two thin ceramic layers covers an outer surface of said heat radiating plate and an outer surface of said cover plate, respectively.

8. A far-infrared-radiation panel heater of double-side heating type according to claim 6, further comprising a hollow frame structure in which said heat radiating plate is fixedly fitted over an entire periphery thereof, and wherein said fluid passage communicates with an interior of said hollow frame structure.

9. A method of controlling flows of a fluid through a multi-stage heating furnace for drying a plurality of large-sized substrates arranged in a stack, comprising a furnace body, and a plurality of shelf heaters arranged within said furnace body such that said shelf heaters are spaced from each other in a vertical direction at a predetermined spacing pitch and such that adjacent ones of said shelf heaters partially define a plurality of drying chambers for accommodating said plurality of large-sized substrates, respectively, each of said plurality of shelf heaters comprising a far-infrared-radiation panel heater of double-side heating type including a heat radiating plate in which a heat-generating body is embedded, said heat radiating plate partially defining a fluid passage and having a multiplicity of blow holes communicating with said fluid passage and open in a lower surface thereof, for fluid communication between said fluid passage and a space outside said panel heater, said panel heater having opposite major surfaces covered with respective thin ceramic layers which emit a far infrared radiation when said heat radiating plate is heated by energization of said heat-generating body, said method comprising the steps of:

blowing a fluid downwards from said lower surface of each of said plurality of shelf heaters, into an internal space within said furnace body, through said blow holes open in said lower surface;

discharging said fluid from said space into an external space outside said furnace body, by suction through suction holes formed for fluid communication between said internal and external spaces through said furnace body.

10. A method according to claim 9, wherein said step of discharging said fluid comprises forming said suction holes through a pair of side heaters disposed on respective inner surfaces of opposite side walls of said furnace body.

* * * * *